United States Patent [19]
Watabe
[11] 3,823,324
[45] July 9, 1974

[54] APPARATUS FOR FORMING RELIEF PRINTING PLATE FROM LIQUID PHOTO-SENSITIVE RESIN

[75] Inventor: Kaname Watabe, Osaka, Japan
[73] Assignee: Teijin Limited, Osaka, Japan
[22] Filed: Mar. 20, 1973
[21] Appl. No.: 343,022

[30] Foreign Application Priority Data
Apr. 1, 1972 Japan .............................. 47-32856

[52] U.S. Cl. .............................................. 250/492
[51] Int. Cl. .............................................. H01j 37/00
[58] Field of Search .................... 250/492, 493, 509

[56] References Cited
UNITED STATES PATENTS
3,743,842 7/1973 Smith .............................. 250/320

*Primary Examiner*—James W. Lawrence
*Assistant Examiner*—C. E. Church
*Attorney, Agent, or Firm*—Wenderoth, Lind & Ponack

[57] ABSTRACT

The present apparatus comprises a hollow structure closed with a transparent glass plate under which a source of ultraviolet rays is provided, the hollow structure having a first space surrounding the glass plate and a second space at the outside of the first space. Spacer provided adjacent to the first space, the upper surface of the spacer means being on a level slightly higher than that of image bearing negative placed upon the glass plate except at some portions forming excessive resin discharge ports; vacuum suction means for a cover film placed upon a negative and extending over the second space, the suction means being communicated with the first and second spaces; a pressing board adapted to abut against a supporting base plate of a liquid photo-sensitive resin when the hollow structure is moved up; and means for discharging a predetermined amount of the resin upon the cover.

7 Claims, 5 Drawing Figures

APPARATUS FOR FORMING RELIEF PRINTING PLATE FROM LIQUID PHOTO-SENSITIVE RESIN

This invention relates to an apparatus for forming a relief printing plate from a liquid photo-sensitive resin.

Recently, in place of lead stereotype, a liquid photo-sensitive resin has been used for forming a relief printing plate. In a known method to form such printing plate, an image bearing negative is placed tightly against a transparent glass plate and covered with a thin transparent film. On the transparent film is spread a liquid photo-sensitive resin which is covered with a supporting base plate. Then, ultraviolet rays are applied to the liquid photo-sensitive resin through the image bearing negative, whereby the liquid photo-sensitive resin exposed to the rays becomes insoluble due to a photo-polymerization reaction. The liquid photo-sensitive resin not exposed to the rays is washed-out by a wash-out solution such as an alkaline aqueous solution. Then, the board which remains is washed by rinsing with liquid such as water. The thus obtained relief board is then subjected to drying and post-exposure treatments for use as a printing plate.

Usually, the relief printing plate has an extremely small thickness on the order of 0.2 to 1 mm. Therefore, the liquid photo-sensitive resin with a high viscosity of from 10 to 50 poises must be formed into a thin layer corresponding to such small thickness.

Some methods have been proposed to form the liquid photo-sensitive resin in such a thin layer. According to one of such methods, a thin space corresponding to the thickness of the printing plate is formed between a supporting base plate attached to a pressing board and a transparent cover film covering an image bearing negative on a glass plate, and then resin is injected into the space. While this method is advantageous in minimizing the mixing of foams and in obtaining high precision of the thickness of the printing plate, it has, on the other hand, the disadvantages that the operation of fixing the cover film in the predetermined position is rather complicated and that a longer time is required for carrying out the injection of resin. A further disadvantage is that the glass plate is flexed by injection pressure and cannot return to its original form within a short period of time. Thus, in this method, it takes a relatively long time to form the printing plate.

According to another method, a measured amount of resin is poured on one side of the transparent cover film covering the negative on the glass plate and is levelled uniformly with a doctor blade to form a thin layer of the resin. Then, a flexible supporting base plate is pressed upon the resin layer from one side thereof along the curvature of a press roller. After the base plate has thus been placed on the thin layer of the resin, the entire assembly is pressed by a pressing board to form a thin layer of the desired thickness. This method is advantageous in simplifying the fixing of the cover film and in reducing the time required for forming the thin resin layer, but, on the other hand, it is hardly possible to inhibit formation of foams when placing the supporting base plate on the resin layer. Further, due to the elastic limit of the base plate, it is impossible to lessen the radius of the press roller beyond a certain limit, particularly when a metal sheet is used for such supporting base plate.

Accordingly, an object of the present invention is to provide an apparatus for forming a relief printing plate of desired thickness from liquid photo-sensitive resin without formation of foams.

Another object of the present invention is to provide an apparatus for forming a relief printing plate from liquid photo-sensitive resin with ease in a relatively short period of time.

Now, the invention will be described in detail by way of preferred embodiments thereof as illustrated in the accompanying drawings, in which.

Figures 1, 2:
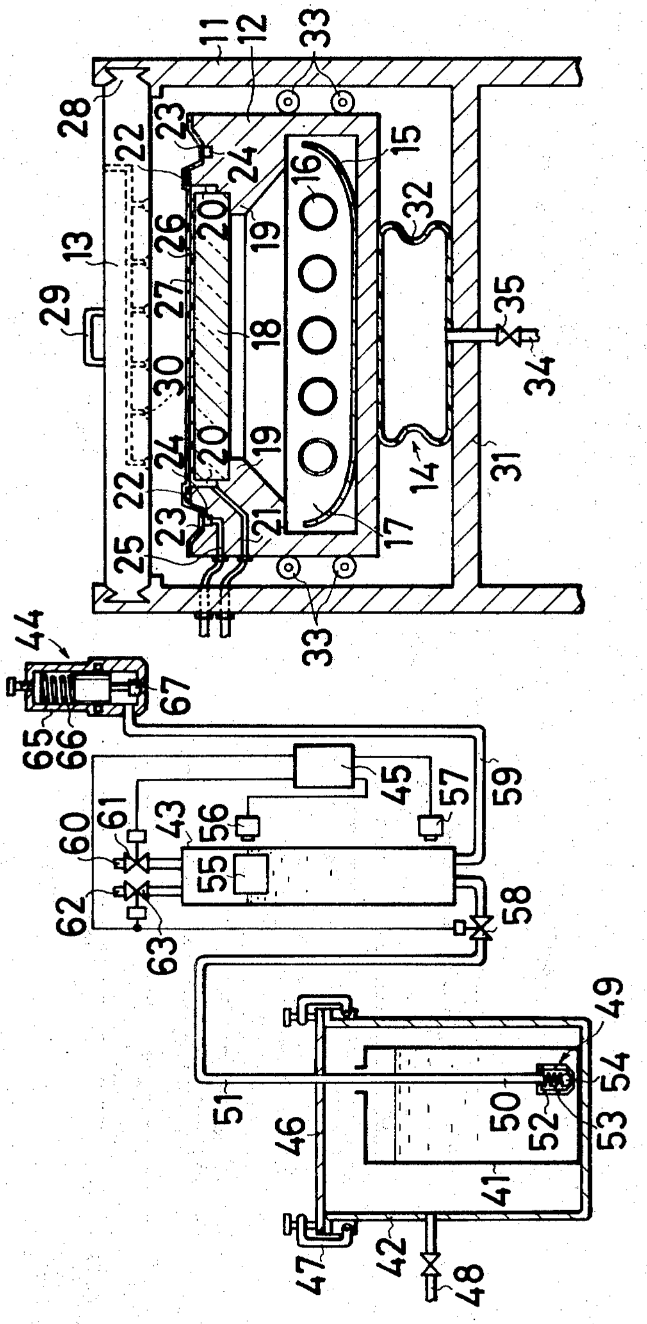
FIG. 1 is a sectional front view showing main portions of an apparatus according to an embodiment of the present invention.
FIG. 2 is a schematic view showing means for discharging a predetermined amount of liquid photo-sensitive resin into the apparatus shown in FIG. 1.
Figure 4:
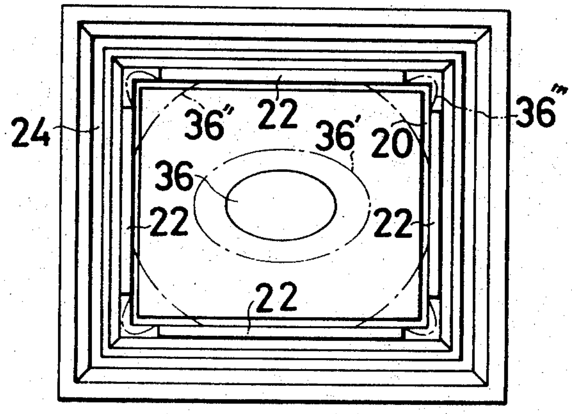
FIG. 4 is a plan view showing a manner in which the mass of the liquid photo-sensitive resin spreads out gradually.

Referring to FIG. 1, there is shown an apparatus for forming a relief printing plate comprising a framework 11, a hollow structure 12 inside of the framwork, a pressing board 13 provided at the upper end portion of the framework 11, and means 14 for moving the hollow structure 12 up and down. The hollow structure 12 has provided therein a recess 17 at the bottom of which light sources 16 of ultraviolet rays are provided above a reflector 15. Preferably, the light sources 16 are several fluorescent lamps or mercury-arc lamps horizontally arranged in parallel. The recess 17 has at its upper surface a stepped shoulder 19 on which a rectangular transparent glass plate 18 is placed to close the recess 17. The stepped shoulder 19 is formed in such a manner that, when the glass plate 18 laminated with an image bearing negative 26 is placed on the shoulder 19, the upper surface of the negative 26 is flush with the inner top surface of the hollow structure 12. The outer peripheral surfaces of the glass plate 18 are slightly spaced from the upper vertical surfaces of the recess 17, thereby forming a space therebetween which is rectangular in plan view as shown in FIG. 4. The space 20 is connected with a vacuum source (not shown) through a passage 21 passing through the upper frame portion of the hollow structure 12. On the inner top surface of the hollow structure 12 adjacent to and defining the rectangular space 20, there are attached four spacer strips 22 which are separated from adjacent ones at four corners adjacent to the rectangular space 20. The upper surface of each spacer strip is at a higher level than that of the image bearing negative 26 placed on the glass plate 18. Formed in the upper frame portion of the hollow structure 12 surrounding the spacer strips 22 is a shallow groove 23 which is rectangular in plan view. At the bottom of the shallow groove 23 is formed a channel 24 which is connected with a vacuum source (not shown) through a passage 25.

The image bearing negative 26 placed on the glass plate 18 is covered with a transparent thin cover film. The cover film 27 is of a size large enough to fully cover the channel 24.

The pressing board 13 is arranged to be movable along guides 28 formed horizontally in the upper portion of the framework 11. This pressing board has a dimension such that when the operator, holding a handle 29 on the top of the board, draws the board out toward the front in FIG. 1 to the limit of its movement it will completely cover the upper part of the glass plate 18. On the other hand, when the board 13 is moved back to its most retracted position, it will completely expose the upper part of the glass plate 18. In the underside of the pressing board 13 are formed regularly arranged holes or crossing grooves 30 connected with a vacuum source (not shown). The pressing board 13 is also arranged such that it can be heated by a suitable heating means (not shown).

The means 14 for moving the hollow structure 12 up and down comprises a flexible bellows 32 interposed between the bottom of the hollow structure 12 and a fixed bed 31 of the framework 11, and several guide rollers 33 supported by the framework 11 and contacted with both side faces of the hollow structure 12. The bellows 32 is connected with a compressed air source (not shown) through a pipe 34 provided with a valve 35, whereby compressed air is either supplied into or discharged out of the bellows 32 to expand or contract it and thereby to raise or lower the hollow structure 12 guided by the guide rollers 33.

Shown in FIG. 2 is means for supplying a fixed amount of liquid photo-sensitive resin onto the cover film 27 in the apparatus of FIG. 1. The supply means comprises a tank 42 in which a material transportation container 41 can be readily put as it is, a measuring cylinder 43, a discharge valve 44, and control means 45 for various valves. The top of the tank 42 is covered airtightly with a closure plate 46 which is secured by clamping bolts 47. The tank 42 is connected with a compressed air source (not shown) through a pipe 48. A pipe 50 provided with a check valve assembly 49 at the bottom end is inserted through the closure plate 46 deep into the container 41 and is connected at the other end to a flexible pipe 51 which is connected to the measuring cylinder 43. The check valve assembly 49 contains in the valve body 52 thereof a ball valve 54 which is pressed downwardly by a spring 53. Therefore, if a pressure greater than the pressing force of the spring 53 is applied in the tank 42, the valve 54 will be pushed up to forcedly feed the resin material, but the valve 54 remains closed when the internal pressure in the tank 42 is less than the pressure of the spring 53.

The measuring cylinder 43 is preferably, made of nonmetalic material and has provided therein a hollow float 55 made of a metalic material and arranged to move up and down in accordance with the liquid level in the cylinder. Externally of and close to the measuring cylinder 43 are provided two proximity switches 56 and 57 designed to cooperate with the float 55. The measuring cylinder 43 is connected through its bottom to the flexible pipe 51 through a valve 58 and also to another flexible pipe 59 which is in turn connected to a discharge valve 44. Extending out of the top of the measuring cylinder 43 are a pipe 60 connected to a compressed air source (not shown) through a valve 61 and a pipe 62 opening into the atmosphere through a valve 63.

The control means 45 functions to control opening and closing of the three valves 58, 61 and 63 on receiving input signals from the upper and lower proximity switches 56 and 57. That is, when the float 55 rises, the upper proximity switch 56 responds magnetically thereto and sends an input signal to the control means 45, whereupon the control means is operated to close the valves 58 and 63 and open the valve 61, causing the resin in the measuring cylinder 43 to be forced downwardly to flow out through the pipe 59 toward the discharge valve 44. On the other hand, when the float 55 descends, the lower proximity switch 57 responds magnetically thereto to send an input signal to the control means 45. Upon receiving the signal, the control means operates to open the valves 58 and 63 while closing the valve 61, allowing the resin liquid in the container 41 to flow into the measuring cylinder 43 to raise the float 55.

The discharge valve 44 houses in its valve body 65 a cylinder valve 67 which is urged downwardly by a spring 66. This valve is forced to open against the elastic force of the spring 66 when the resin liquid is forcedly supplied thereinto through the pipe 59, but it is closed under the force of spring 66 when the force applied by the resin is stopped.

In the operation of the present apparatus, firstly the image bearing negative 26 is placed on the glass plate 18 and then the negative 26 is covered with the thin transparent cover film 27 having a thickness of about 5 to 20μ and large enough to cover the channel 24. Then the channel 24 is evacuated through the passage 25 which is communicated with the vacuum source, so that the peripheral edges of the cover film 27 are fastened to the frame portions of the hollow structure 12. The space 20 is also evacuated through the passage 21 and pressure is applied from above the cover film 27 preferably by means of a rubber roller (not shown) so as to completely get rid of air between the cover film 27, negative 26 and glass plate 18 to thereby let them abut closely against each other. According to this arrangement, should air enter between the cover film 27 and the frame portion of the hollow structure 12 from outside of the cover film 27, such air is released to the vacuum source from the channel 24 located at the outside of the space 20 and hence the vacuum in the space 20 is not affected at all. This arrangement also eliminates any inward shifting or displacement of the cover film 27, thereby preventing the cover film from extending down into the space 20 to reduce the sucking force.

Referring now to the discharge of the resin material the container 41 filled with such resin material is put as it is into the tank 42 (that is, the contents of the container 41 are not transferred into the tank). After inserting the pipe 50 into the container 41 as shown, compressed air is fed into the tank through the pipe 48 to thereby forcedly discharge the resin from the container 41. In this case, since no air is entrained in the liquid resin, which would otherwise be caused during transfer of material from the container into the tank, there is required no labor and time for removing any foam.

Figure 3:
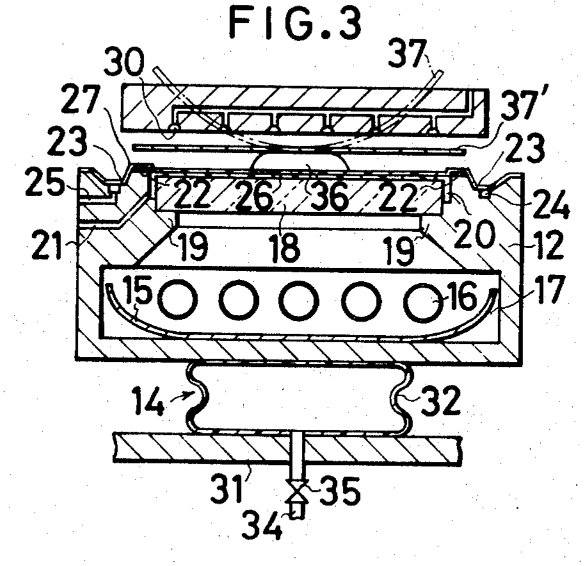
FIG. 3 is a sectional front view showing the manner of placing a supporting base plate upon a mass of the photo-sensitive resin.

A fixed amount of the liquid resin, which has been measured by the measuring cylinder 43, is discharged out through the discharge valve 44 to drop onto substantially the central part of the flat cover film 27. In FIGS. 3 and 4, reference numeral 36 denotes a mass of such liquid resin. The discharge valve 44 is disposed closely adjacent to the cover film 27 so that no air will be entrained or mingled into the liquid resin when it is discharged and dropped. As soon as the fixed amount of the liquid resin is discharged, the cylinder valve 67 is rapidly closed under the pressure of spring 66 in the discharge valve 44, so that no air is permitted to enter the valve and hence no foam is present in the liquid resin when it is discharged.

Then a supporting base plate 37 coated with an adhesive layer on the underside thereof is bent in the form of an arch as shown in FIG. 3 and the underside is touched lightly on the mass of the liquid photo-sensitive resin 36. Then the operator slowly lowers his hands, allowing the base plate to return to its straight form owing to its own elasticity. The straightened base plate is shown by reference numeral 37'. In this manner, the base plate 37' can be placed on the liquid photo-sensitive resin layer without any foam being formed therebetween. Thereafter, the pressing board 13 is drawn out toward the front of FIGS. 1 and 3 and compressed air is supplied to the bellows 32 to raise the hollow structure 12. As the hollow structure 12 rises steadily even after the base plate 37' contacts the underside of the pressing board 13, the mass of liquid photo-sensitive resin spreads out gradually in the manner shown by chain lines 36', 36'' and 36''' in FIG. 4 until finally the excess resin flows out through discharge ports at the four corners defined by spacer strips 22 and is accumulated on the cover film 27 in the shallow groove 23. The excessive resin accumulated in the shallow groove 23 cannot soil the machine parts, particularly the pressing board 13. Such excessive resin is wrapped up in the cover film 27 when the latter is stripped off later, and is discarded therewith.

As the four spacer strips 22 abut against the supporting base plate 37' under the pressing board 13, the liquid photo-sensitive resin layer is confined to the shape defined by the four spacer strips 22 and to the thickness of the spacer strips, which shape and thickness conform to the actual rectangular or square shaped relief printing plate. In order to ensure the accuracy of the thickness of the formed printing plate, with a tolerance in practical use to within $\pm 25\mu$ at each part of the printing plate, the underside of the pressing board 13 is subjected to needed corrections corresponding to the surface of the glass plate, as described later. The base plate 37' is tightly stuck against the thus corrected underside of the pressing board 13 by evacuating air through the regularly arranged holes or crossing grooves 30 in the underside of the pressing board 13.

From the sources 16 of the ultraviolet rays, such rays are applied to the photo-sensitive resin for a predetermined period of time according to a known method to induce a photo-polymerization reaction through the image bearing negative 26. Then, the vacuum is relieved, the hollow structure 12 is lowered, and the pressing board 13 is retracted to its original position. The base plate 37' to which the resin layer is firmly attached is stripped off from the cover film 27. The resin layer is then subjected to finishing steps comprising washing-out of non-exposed resin portions, drying and post-exposure treatments to finally obtain a desired relief printing plate. Any leftover liquid photo-sensitive resin on the cover film is wrapped up in the cover film when the latter is replaced with a new one, and is discarded with such used cover film.

A preferred method of correcting the underside of the pressing board 13 in order to correspond to the surface of the glass plate 18 is as follows. Firstly, the underside of the pressing board 13 is coated with an adhesive layer, and then liquid photo-sensitive resin or thermosetting resin is applied thereon. This pressing board is pressed against the surface of the glass plate 18 covered with, in the recited order, a transparent film of the same thickness as the total thickness of the negative and the relief printing plate to be formed, and a cover film. Then ultraviolet rays or heat is applied to the resin on the board 13. This method allows easy formation of the underside of the pressing board 13 correctly corresponding to the surface of the glass plate 18, according to the principles of molding.

It is preferable to heat the photo-sensitive resin layer by heating means in the pressing board 13 in a manner such that the resin temperature will become higher at the part closer to the supporting base plate than at the part remote therefrom. In such method, the photo-polymerization reaction in the resin part contacting the base plate is effected by the actions of the light rays and heat. Such treatment makes the base portion of the extremely fine lines or points of the relief printing plate tough and break-proof. The preferred temperature range, although it can vary somewhat according to the type and quality of photo-sensitive resin used, is usually from 25° to 70°C in the supporting base plate side and from 20° and 40°C on the exposed side.

Figure 5:
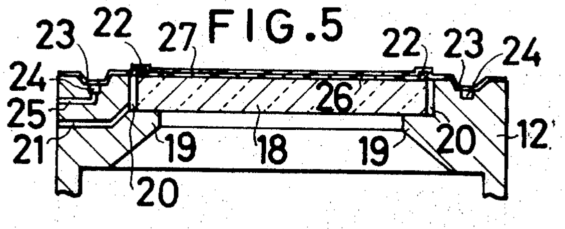
FIG. 5 is a sectional front view showing a modification of the spacer assembly attached on a glass plate.

In the foregoing embodiment, the spacer strips 22 are attached to the inner top surface of the hollow structure 12 for regulating the shape and thickness of the relief printing plate, but the present invention is not limited to such arrangement. For example, in another embodiment shown in FIG. 5, the spacer strips 22 are attached around the periphery of the glass plate 18. However, in this case, there are also provided a rectangular space 20 and a rectangular channel 24 at the outside of the spacer strips 22. The space 20 and the channel 24 are connected with vacuum sources through passages 21 and 25, respectively. Also, each spacer strip 22 is separated from adjacent ones at the corners of the rectangular glass plate to provide discharge ports for the excess resin.

Although the present invention has been described with reference to the preferred embodiments thereof, modifications and alterations may be made within the spirit of the present invention. For example, the spacer strips 22 may be made of a one piece rectangular frame-like member in which angled portions corresponding to the excess resin discharge ports are made thinner. Furthermore, an image bearing negative 26 large enough to cover the rectangular space 20 may be stuck by vacuum in the space 20.

What is claimed is:

1. An apparatus for forming a relief printing plate from a liquid photo-sensitive resin comprising:

a framework;

a hollow structure moved up and down in said framework and closed with a transparent glass plate on which an image bearing negative and a transparent thin cover film are placed in that order to form a lamination, said hollow structure containing therein a source of ultraviolet rays adapted to apply the rays through said lamination, said glass plate being slightly separated from inner upper vertical surface of said hollow structure and, thereby, forming a first space surrounding said glass plate;

spacer means provided adjacent to said first space, the upper surface of said spacer means being on a level slightly higher than that of said image bearing negative except at some portions forming excess resin discharge ports;

vacuum suction means for said cover film extending over a second space formed in the top surface of said hollow structure at the outside of said first space, said suction means comprising a vacuum source communicating with said first and second spaces;

a pressing board adapted to abut against a supporting base plate of the liquid photo-sensitive resin when said hollow structure is moved up; and means for discharging a predetermined amount of the liquid photo-sensitive resin onto a center portion of said cover film.

2. An apparatus as claimed in claim 1, wherein said discharge means comprises:

a tank in which a material transportation container can be put as it is, said tank having a compressed air supply means and a closure cover through which a first pipe extends with a check valve at the lower end thereof in said container;

a measuring cylinder connected with the other end of said first pipe through a first valve means, said measuring cylinder having a second valve means through which said cylinder communicates with the atmosphere and a third valve means through which compressed air is supplied to said cylinder;

control means for said three valve means, said control means operating said first and second valve means and closing said third valve means when said resin in said cylinder is decreased a predetermined amount, said control means closing said first and second valve means and opening said third valve means when said resin in said cylinder is increased a predetermined amount; and a discharge valve means communicating with said measuring cylinder through a second pipe and discharging said resin when said compressed air is supplied to said measuring cylinder through said third valve means.

3. An apparatus as claimed in claim 1, wherein said spacer means comprises at least four strips attached to the inner top surface of said hollow structure, said strips being separated from each other at places adjacent to angled corners of said first space to form said excessive resin discharge ports; and said second space is a channel formed in the bottom of a shallow groove at the outside of said four strips.

4. An apparatus as claimed in claim 1, wherein said spacer means comprises at least four strips attached to the periphery of said glass plate, said strips being separated from each other at angled corners of said glass plate to form excessive resin discharge ports; and said second space is a channel formed in the bottom of a shallow groove formed in the top surface of said hollow structure.

5. An apparatus as claimed in claim 1, wherein said pressing board has at its underside means for sticking said supporting base plate for said resin thereto by vacuum.

6. An apparatus as claimed in claim 1, wherein said pressing board is provided at its underside with a resin layer which corresponds to the shape of the upper surface of said glass plate.

7. An apparatus as claimed in claim 1, wherein said pressing board is movable back and forth along upper portion of said framework.

* * * * *